(12) United States Patent
Ng

(10) Patent No.: US 11,347,310 B2
(45) Date of Patent: May 31, 2022

(54) TRACKING POSITIONS OF PORTIONS OF A DEVICE BASED ON DETECTION OF MAGNETIC FIELDS BY MAGNETIC FIELD SENSORS HAVING PREDETERMINED POSITIONS

(71) Applicant: Facebook Technologies, LLC, Menlo Park, CA (US)

(72) Inventor: Shiu Sang Ng, Kirkland, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 547 days.

(21) Appl. No.: 16/441,896

(22) Filed: Jun. 14, 2019

(65) Prior Publication Data
US 2020/0272235 A1     Aug. 27, 2020

Related U.S. Application Data
(60) Provisional application No. 62/808,679, filed on Feb. 21, 2019.

(51) Int. Cl.
| | |
|---|---|
| *G06F 3/01* | (2006.01) |
| *G06F 3/0346* | (2013.01) |
| *G01B 7/004* | (2006.01) |
| *G01R 33/02* | (2006.01) |

(52) U.S. Cl.
CPC ............. *G06F 3/014* (2013.01); *G01B 7/004* (2013.01); *G06F 3/017* (2013.01); *G06F 3/0346* (2013.01); *G01R 33/02* (2013.01)

(58) Field of Classification Search
CPC ........ G06F 3/014; G06F 3/017; G06F 3/0346; G01B 7/004; G01R 33/02
See application file for complete search history.

(56) References Cited

U.S. PATENT DOCUMENTS

| | | | | |
|---|---|---|---|---|
| 2016/0246369 | A1* | 8/2016 | Osman | A63F 13/212 |
| 2019/0317607 | A1* | 10/2019 | Lin | G06F 3/0346 |

* cited by examiner

*Primary Examiner* — Phuong H Nguyen
(74) *Attorney, Agent, or Firm* — Fenwick & West LLP

(57) ABSTRACT

A wearable device includes a plurality of magnetic field generators positioned at different points to be tracked. The magnetic field generators emit magnetic fields that are sensed by a plurality of magnetic field sensors having known positions relative to each other. The wearable device may have magnetic field generators placed at tracked points corresponding to portions of the fingers and the palm of the device, and magnetic field sensors located at predetermined positions. A position analyzer determines the spatial position of the tracked points on the palm as well as the tracked points on the fingers from the output signals of the magnetic field sensors. From the determined spatial positions of the tracked points, a gesture identification system determines a gesture corresponding to the spatial positions of the points of the wearable device where the magnetic field generators are positioned.

25 Claims, 7 Drawing Sheets

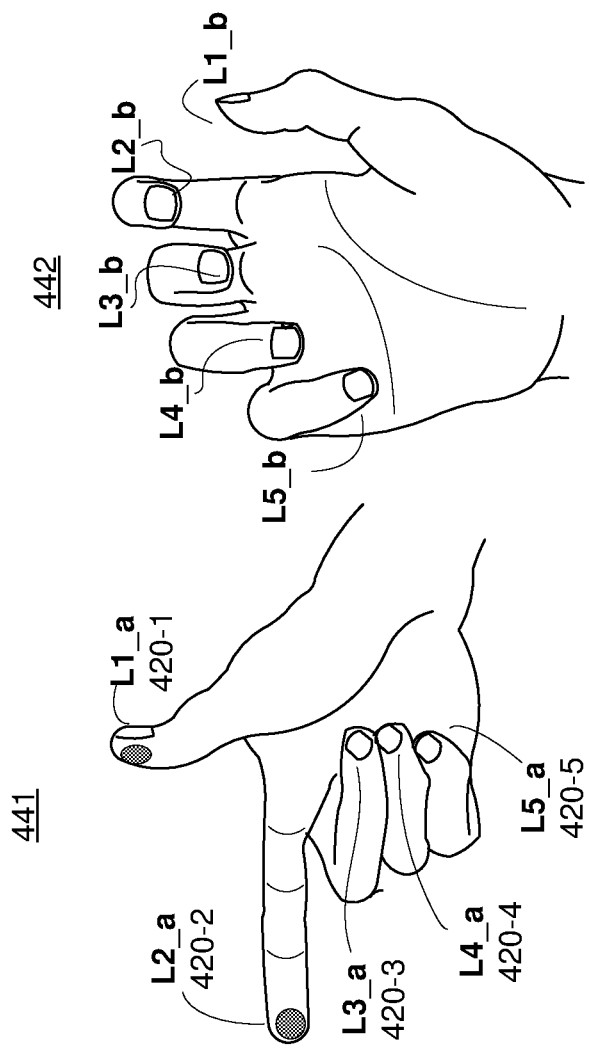
FIG. 4A
FIG. 4B
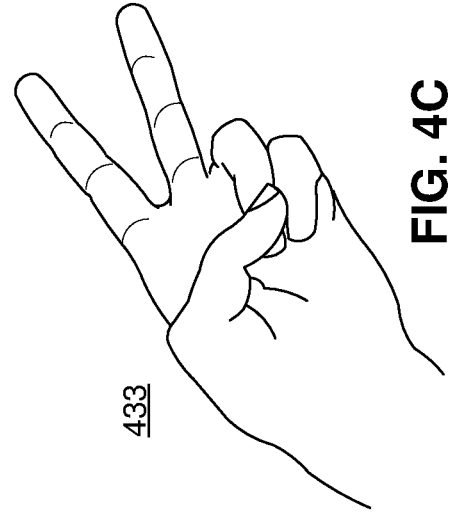
FIG. 4C
| Finger Location-Gesture Mapping Table 425 | |
|---|---|
| State Descriptor 430 | Gesture 440 |
| L_a 431 | 441 |
| L_b 432 | 442 |
| L_c 433 | 443 |
| ... | ... |
FIG. 4D

TRACKING POSITIONS OF PORTIONS OF A DEVICE BASED ON DETECTION OF MAGNETIC FIELDS BY MAGNETIC FIELD SENSORS HAVING PREDETERMINED POSITIONS

CROSS-REFERENCE TO RELATED APPLICATIONS

This application claims the benefit of U.S. Provisional Patent Application No. 62/808,679, filed on Feb. 21, 2019, which is incorporated by reference herein in its entirety.

BACKGROUND

Use of wearable devices as well as virtual reality (VR) or augmented reality (AR) devices has become more commonplace. Conventional wearable VR or AR devices commonly receive inputs by capturing audio data (e.g., voice comments), capturing gestures, receiving user interactions with one or more of a limited number of buttons, or receiving user interaction via a limited touch area on the wearable VR or AR device. However, many of these conventional input mechanisms are inconvenient or awkward for users to operate in various contexts.

When used in conjunction with a head mounted display device, such as those used in VR or AR systems, conventional input mechanisms have additional complications. For example, when interacting with a VR system, users perform gestures to simulate interaction with objects. To identify these gestures, conventional virtual reality systems use computer vision techniques to identify relative and absolute locations of portions of a user's body. However, computer vision techniques are limited to identifying gestures from portions of a user's body that are within a field of view of an image capture device. This decreases the effectiveness of computer vision detection and identification of gestures when a portion of a user's body is occluded from the field of view of the image capture device. Some virtual reality systems use inertial measurement units positioned on portions of a user's body to track gestures, but the inertial measurement units suffer from drift error requiring frequent sensor calibration to compensate for the drift error.

SUMMARY

A wearable device (such as a glove or other control adapted to be worn on a portion of a user's body) includes a gesture identification system and a hand position system based on determining spatial locations of points being tracked (i.e., "tracked points") on the wearable device. In embodiments where the wearable device is a glove, the tracked points used by the gesture identification system are the fingertip locations of the wearable glove as determined when worn by the user. Similarly, when the wearable device is a glove, the tracked points used by the hand position system are one or more points on a palm of the wearable glove as determined when worn by the user. The spatial positions of the tracked points on the wearable device are determined based on magnetic fields generated by a magnetic field generators that are located at the tracked points and detected by magnetic field sensors at known positions. For example, a plurality of magnetic field sensors with known positions relative to each other detect generated magnetic fields. The magnetic field sensors may be located on the wearable device or near the wearable device. Thus, the magnetic field generators (e.g., active transmitters, permanent magnets, or electromagnets) act as proxy locations for the tracked points.

In one embodiment, the wearable device is a glove having magnetic field generators on one or more fingers of the glove. The magnetic field generators generate magnetic fields that are sensed by the plurality of magnetic field sensors that located at a predefined location on or with respect to the glove. For example, at least two magnetic field sensors are located at a known fixed distance from each other on a palm of the glove or on a dorsal aspect (i.e., back side to the palm) of the glove, while an additional magnetic field sensor is located at the wrist of the glove, such as a portion of the glove configured to be worn at the wrist of the user's hand. Alternatively, or additionally, the magnetic field sensors are separate from the wearable device, in predetermined or known locations. For example, the magnetic field sensors are located on a table top or on a headset worn by the user. In the preceding example, the tracked points correspond to the portions of the figures of the glove where the magnetic field generators are located. The magnetic field sensors on the palm at the known locations relative to each other sense magnetic field strength and direction of the magnetic fields generated by each of the magnetic field generators. Using the known locations of the magnetic field sensors, a spatial position of each of the tracked locations is determined with respect to a known coordinate system. In various embodiments, different magnetic field generators emit magnetic fields with different frequencies or emit magnetic fields at different times, allowing identification of magnetic fields emitted by different magnetic field generators. The spatial position of each of the tracked points is then combined to generate a representative state descriptor of the combined positions of at least a set of the tracked points. This representative state descriptor is subsequently used either with a stored mapping of positions of points, or via real time modeling, to identify a gesture made by the user using the wearable device.

In some embodiments, locating the magnetic field sensors at the palm of the glove (or on a dorsal side of the glove contacting a back of the user's hand) and at the wrist of the glove, allows determination of positions of the tracked points on the glove (i.e., the points where the magnetic field generators are located) relative to the palm (or to the dorsal side of the glove), and relative to the wrist. In some embodiments, two magnetic field sensors may be both located on the palm of the hand or be both located on a dorsal side of the glove contacting a back of the user's hand, so that the two magnetic field sensors are in a fixed position relative to each other with a known fixed distance from each other, and each tracked point's position may be determined relative to the magnetic field sensors. In other embodiments, locating the magnetic sensors at a head mounted display (HMD) or at a stationary location enables the tracked points on the glove (i.e., the points where the magnetic field generators are located) to be located relative to the HMD or relative to the stationary location. In other embodiments, magnetic sensors are located at the palm (or back) of the glove, at the wrist of the glove, and also at a location external to the glove (e.g., a known stationary location or on a HMD), allowing of positions of tracked points on the glove (i.e., the points where the magnetic field generators are located) to be determined in a relative coordinate system with respect to a magnetic field sensor or with respect to an absolute coordinate system using the magnetic field generator at the known stationary location. The positions of the tracked points on the glove (e.g., positions on fingers of the glove) are used by the gesture identification system. In some embodiments, an additional magnetic field generator may be located on the palm of the hand (or on a dorsal side of the glove contacting a back of the user's hand) to act as a proxy location for the point on the palm (or a point on the dorsal aspect of the palm). One or more magnetic field sensors located at the wrist may be used to determine the position of the tracked point on the palm with respect to the one or more wrist magnetic field sensors by the hand position system.

DESCRIPTION OF THE DRAWINGS

FIGS. 4A-4C are example gestures that may be identified, in accordance with one or more embodiments.

FIG. 4D is one example of a mapping of fingertip locations to gestures, in accordance with one or more embodiments.

DETAILED DESCRIPTION

Overview

A wearable device (such as a glove or other control adapted to be worn on a portion of a body of a user) includes a position sensing apparatus that determines spatial positions of tracked points on the wearable device. Magnetic field generators are located at the tracked points on the wearable device and emit magnetic fields that are detected by a plurality of magnetic fields sensors that have known positions relative to each other. The spatial positions of the tracked points on the wearable device are used to determine gestures made by a user wearing the wearable device. Gestures may be viewed as combinations of determined spatial positions for different tracked points on the wearable device. For example, a gesture is a combination of spatial positions determined for portions of the wearable device corresponding to different portions of a user's body (e.g., different fingers or a user's hand). As used herein, the term "magnetic field generator" refers to a device that generates one or more magnetic fields. Example magnetic field generators include an actively driven transmitter using alternating current signals (e.g., at a range of 1 KHz to 10 MHz) to generate the magnetic fields, an electromagnet, a permanent magnet, a programmable magnet, and a polymagnet. The term "magnetic field sensor," as used herein, refers to devices that sense one or more magnetic fields and generate output signals based on the detected one or more magnetic fields.

For an arbitrary location in the space, the strength of a magnetic field H, generated by a magnetic field generator (e.g., a magnet) and sensed by a magnetic field sensor that is located at a particular point, is inversely proportional to the cube of the distance r (i.e., the distance between the sensing point and the magnetic field generator) and θ (i.e., the angle between the magnetic field generator's north and the sensor). The magnetic field H may be decomposed into two orthogonal vectors (e.g., in radial space), $H_r$ and $H_θ$. These two vectors are the basis in this 2D magnetic-field space and can be mathematically represented in terms of r and θ.

$$H_r = M \cos θ / 2π r^3 \quad (1)$$

$$H_θ = M \sin θ / 4π r^3 \quad (2)$$

where M is a magnetic moment. When the magnetic field generator is an electromagnet, the value of M is related to the permeability of core material, current, and area of the electromagnet. Given an actively driven transmitter using a constant alternating current driving a circular current loop, the magnetic moment, M, may be assumed to be a constant, and equations (1) and (2) above represent the generated magnetic fields at locations, r, greater than threshold distance from the center of the current loop.

Figure 1B:
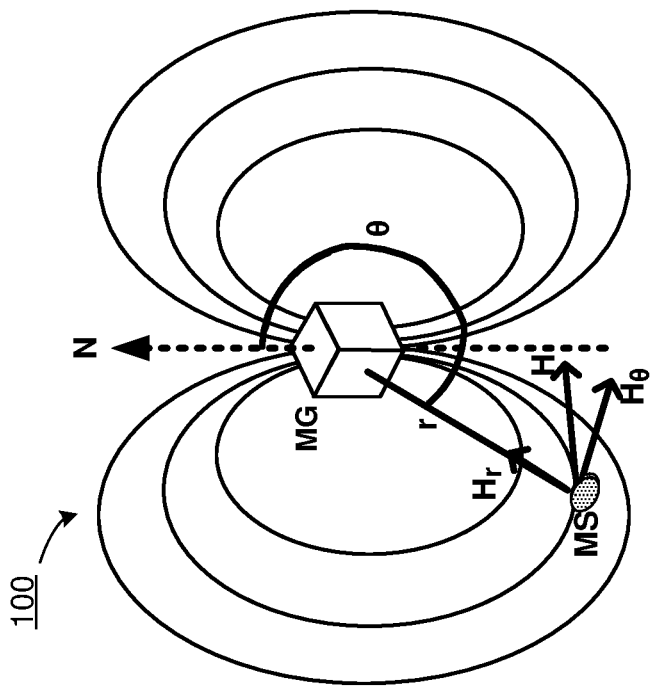
FIGS. 1A-1D illustrate frameworks within which spatial locations of magnetic field generators and magnetic field sensors are represented, in accordance with one or more embodiments.
Figure 1A:
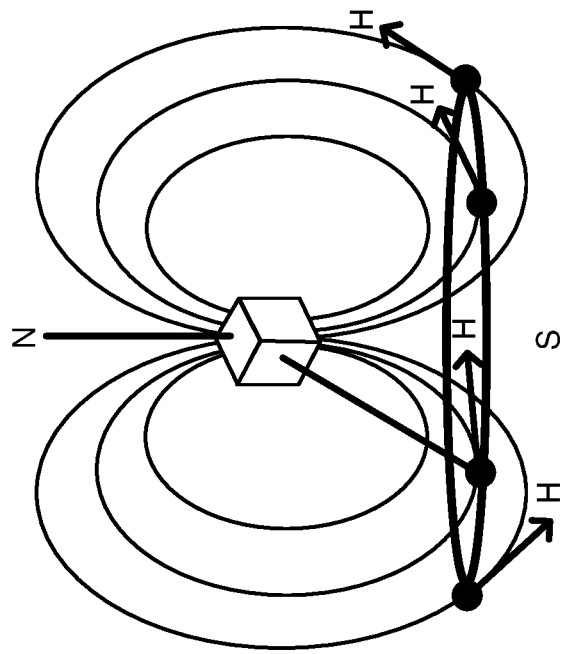

FIG. 1A depicts a magnetic field generator MG generating a magnetic field 100. In the example shown in FIG. 1A, a magnetic field sensor MS senses the magnetic field generated by the magnetic field generator MG. The sensed magnetic field is depicted by the magnetic field vector H that may be decomposed into orthogonal components in radial space as ($H_r$, $H_θ$).

From equations (1) and (2) above, the magnetic field strength is the same for points having a common distance r from the magnetic field generator and having a common angle θ relative to a specific axis of the magnetic field generator MG (e.g., a magnetic axis along a north pole of the magnetic field generator MG). FIG. 1B shows that locations L1, L2, L3, L4, on a circumference of a circle having a center that is a magnetic axis of the magnetic field generator MG, have a common magnetic field strength, as locations L1, L2, L3, L4 are a common distance from the magnetic field generator MG and have a common angle relative to the magnetic axis of the magnetic field generator MG.

Embodiments described herein determine the position of the magnetic field generator, given a known location of the magnetic field sensor with respect to a chosen coordinate system. From equations (1) and (2) above, the distance (r) and orientation (θ) may be calculated from the magnetic field ($H_r$ and $H_θ$). However, a spatial ambiguity exists in the 3D space (such as illustrated by points L1, L2, L3, L4 in FIG. 1B) as, from a top view of the magnetic field generator MG, points located on a circle concentric with the axis of the magnetic field generator MG have a common distance and angle from the magnetic field generator MG, so the magnetic field strength is the same at each point along the circle concentric with the axis of the magnetic field generator MG. The magnetic field sensor MS detects the same measurement for points along the circle concentric with the axis of the magnetic field generator MG, resulting in spatial ambiguity of the location of the magnetic field generator MG relative to the magnetic field sensor MS.

According to one or more embodiments, to resolve the spatial ambiguity described above, a total magnetic field strength is calculated based on equation (3):

$$\|H\|^2 = (H_r)^2 + (H_\theta)^2 = K^* r^{-6} * (3\cos^2\theta + 1) \quad (3)$$

where $\|H\|$ is the norm-2 of the sensor vector, r and θ are the distance between sensors and electromagnet (as in equations 1 and 2 above), and K is a constant. The constant K is a factor of constant M (e.g., $K = M^2/16\pi^2$).

The configuration described above may be used to define a "beacon system" in which the received signal strength (i.e., the total magnetic field strength $\|H\|$) relates to the distance from the signal source (i.e., r) and angle at which the signal is received (i.e., θ). However, equation 3 is under-constrained since there are two unknown variables (r, θ) and a single equation (e.g., from $\|H\|$). Hence, the next step is to obtain an over-constrained system by remodeling the two unknown variables (r, θ).

Figure 1D:
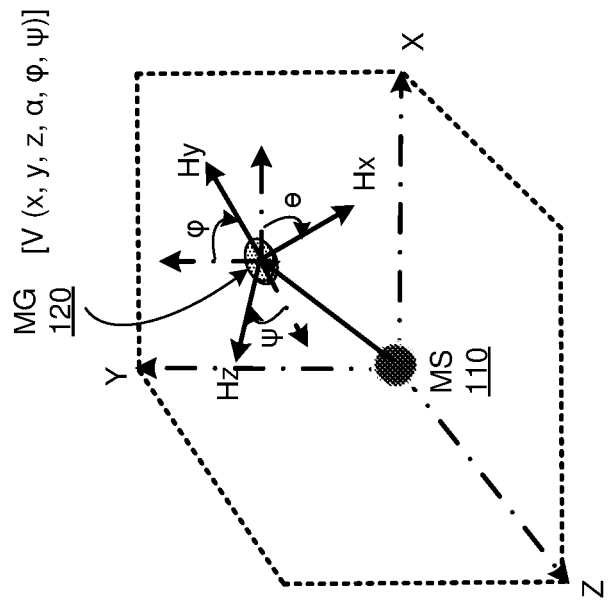
Figure 1C:
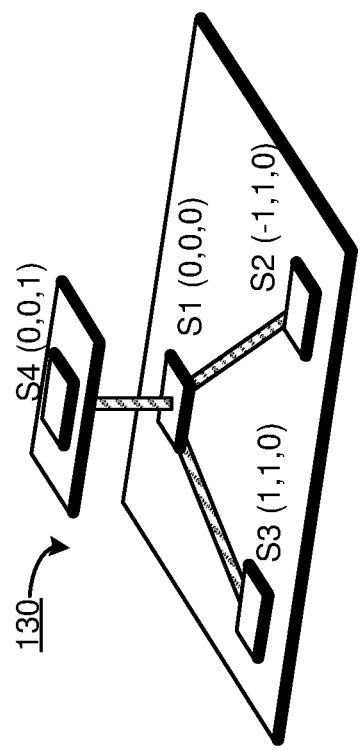

To obtain an over-constrained system, a fixed or known layout of the magnetic field sensor MS is used to define a coordinate system 130, as shown in FIG. 1C. In FIG. 1C, the magnetic field sensor MS includes multiple sensing elements S1, S2, S3, S4. The multiple sensing elements sense the magnetic field along the particular axes of the coordinate system, such as the coordinate system 130 of FIG. 1C. Thus, for example, sensing element S1 is used as the origin, and coordinates of other sensing elements S2, S3, S4 are ascertained with respect to the coordinates of sensing element S1. In the example of FIG. 1C, sensing elements S1, S2, and S3 are coplanar, while sensing element S4 is positioned above sensing element S1 along a direction orthogonal to the plane in which sensing elements S1, S2, and S3 are positioned. Alternatively, the coordinate system 130 of FIG. 1C is determined from multiple magnetic field sensors MS having placements relative to each other paralleling the placement of the sensing elements S1, S2, S3, S4 shown in FIG. 1C.

FIG. 1C illustrates a coordinate system 130 for trilateration and for determination of spatial locations of magnetic field generators and magnetic field sensors, according to one or more embodiments. In some embodiments, the coordinate system 130 of FIG. 1C illustrates a single magnetic field sensor MS that includes a plurality of constituent sensing elements S1, S2, S3, S4 (e.g., magnetometers). Alternatively, each sensing element S1, S2, S3, S4 of the coordinate system 130 shown in FIG. 1C may correspond to a distinct magnetic field sensor MS.

The two unknown variables (r, θ) of equations (1)-(3) are replaced with the 3D position (x, y, z) of the magnetic field generator MG in the coordinate system of FIG. 1D. Thus, given the coordinate system 130, the two variables (r, θ) can be represented in terms of the 3D position (x, y, z) of the magnetic field generator MG using equations (4) and (5):

$$r_1 = (x^2 + y^2 + z^2)^{1/2} \quad (4)$$

$$\cos\theta_1 = z/r_1 \quad (5)$$

Similarly, these three shared variables (x, y, z) can be substituted into the equation (3) for the other three sensing elements of a magnetic field sensor MS, resulting in equations (6)-(11):

$$r_2 = ((x+1)^2 + (y-1)^2 + z^2)^{1/2} \quad (6)$$

$$\cos\theta_2 = z/r_2 \quad (7)$$

$$r_3 = ((x-1)^2 + (y-1)^2 + z^2)^{1/2} \quad (8)$$

$$\cos\theta_3 = z/r_3 \quad (9)$$

$$r_4 = (x^2 + y^2 + (z-1)^2)^{1/2} \quad (10)$$

$$\cos\theta_4 = z/r_4 \quad (11)$$

The resulting system of equations is over-constrained and has four equations (of equation 3) from each of four sensing elements S1, S2, S3, S4 of the magnetic field sensor MS to be solved for three shared variables (x, y, z). In some embodiments, the magnetic field generator is an actively driven transmitter using alternating current signals (e.g., at a range of 1 KHz to 10 MHz) to generate the magnetic fields. In some embodiments, the magnetic field generator MG comprises a programmable magnet (e.g., a polymagnet) and magnetic field properties of the magnetic field generator MG are programmable, controllable, and/or reconfigurable. In some embodiments, the programmable, controllable, and/or reconfigurable magnetic field properties include a number of magnetic poles, a density of magnetic poles (e.g., number and distribution of magnetic poles over a given surface area of the magnetic field generator MG), a spatial orientation/configuration/layout of magnetic poles, magnetic field strength, a variation of magnetic field strength as a function of spatial coordinates (e.g., distance from the magnetic field generator MG), focal points of the magnetic field, mechanical forces (e.g., attraction, repulsion, holding, alignment forces) between poles of the same polymagnet or between polymagnets, and so on. For example, a spatial flux density or flux orientation mapping can be programmed or configured (e.g., to be distinct from the relationship described in equations (1) and (2)) to uniquely or distinctly encode position and/or orientation of different magnetic field generators MG or different magnetic field sensors MS. In some embodiments, polymagnets and programmable magnetic generators can be programmed to provide stronger magnetic fields, or fields concentrated within shorter ranges to improve resolution and accuracy of position sensing within the shorter sensing ranges. In some embodiments, magnetic field generators are implemented by winding a coil around a cylindrical or flat ferrite core, printing winding on thin, flexible magnetic core material, performing 3-D printing or embraiding as part of the thread around a glove finger (with or without magnetic core material as liner), and using air coils for limited range requirements).

In some embodiments, when the magnetic field generator MG is a programmable magnet or an electromagnet, the signals applied to the magnetic field generator MG to generate the magnetic field may be optionally pre-processed or normalized by a function of or corresponding to $1/r^3$ corresponding to the effect of spatial distance on the magnetic field components in a radial coordinate space. For example, a "non-affine" transformation may be applied to the signals applied to the magnetic field generator MG to transform the input signals based on a normalization function corresponding to $1/(r^3)$ in radial coordinate (r, θ) space.

FIG. 1D illustrates an alternative 3-dimensional framework 140 for determining spatial position vectors in three-dimensional (3D) Cartesian space for a configuration with a single magnetic flux sensor (MS) 110 and single magnetic generator (MG) 120. In some embodiments, a spatial position is expressed as a vector with multiple components representing spatial coordinates (distance and/or orientation) in a multi-dimensional space. For example, in a three-dimensional (3D) coordinate system, the vector components of a spatial position vector include Cartesian distances along three orthogonal Cartesian coordinate axes (X, Y, Z) or angular orientation (angles α, φ, ψ) defined with respect to three mutually perpendicular Cartesian axes (X, Y, Z) or defined with respect to mutually perpendicular Cartesian planes (YZ, XZ, and XY). In some embodiments, the spatial position vectors may include Cartesian distances along three orthogonal Cartesian coordinate axes (X, Y, Z), but not along the angular orientations (angles α, φ, ψ).

In one or more embodiments, each magnetic field generator (MG) 120 includes one or more magnets; each magnet of a given magnetic generator (MG) 120 may be configured to generate a corresponding magnetic field oriented along a distinct direction (e.g., a distinct coordinate axis) from other magnets of that magnetic field generator 120. In some embodiments, a magnetic field generator 120 includes three magnets that generate three orthogonal magnetic fields along three orthogonal Cartesian coordinate axes (Hx, Hy, and Hz, as illustrated for MG 120 in FIG. 1D). Similarly, each magnetic flux sensor (MS) 110 includes one or more constituent sensing elements (e.g., one or more magnetometers), each sensing element (magnetometer) configured to generate a signal responsive to a detected magnetic field that is oriented along a distinct direction (e.g., a distinct coordinate axis). For example, a magnetic field sensor (e.g., MS 110 of FIG. 1D) may include three sensing elements (such as Hall-effect sensors) configured to generate (output) corresponding signals (e.g., current outputs) that are proportional to and responsive to magnetic fields along the three different orthogonal axes (X, Y, and Z) of a three-dimensional spatial coordinate system.

In such embodiments, a spatial position vector (e.g., vector V, as illustrated in FIG. 1D) may be defined for each pairing of magnetic field generator 120 and magnetic field sensor 110 to represent Cartesian distances along three orthogonal Cartesian coordinate axes (X, Y, Z) between the magnetic field generator 120 and the magnetic field sensor 110 included in the pairing. The spatial position vector may also include angular orientations represented as angles (α, φ, ψ) between the magnetic field axes of the magnetic field generator 120 (e.g., Hx, Hy, and Hz) and the sensing axes of the magnetic field sensor 110 (e.g., X, Y, and Z). The angles may alternatively be computed with respect to the three mutually perpendicular Cartesian planes (YZ, XZ, and XY) that are defined for the magnetic field sensor 110 or for the magnetic field generator 120.

In some embodiments, magnetic fields generated by multiple different magnetic generators 120 are distinguishable from one another, allowing a magnetic field sensor 110 to identify magnetic fields from the different magnetic generators, which allows separate determination of positions of the different magnetic field generators 120. The magnetic fields generated by different magnetic field generators 120 are distinguished from each other using time division multiplexing (TDM) or frequency division multiplexing (FDM) in various embodiments. For example, a magnetic field generator 120, such as an electromagnet, generates a magnetic field by applying a driving current to magnetic field emitting coils of the magnetic field generator 120. Using TDM, the driving current is applied sequentially to the magnetic field emitting coils of different magnetic field generators 120 at different times. Thus, when a magnetic field is generated by a particular magnetic field generator 120 at a particular time interval, the other magnetic field generators 120 do not emit magnetic fields during the particular time interval. Hence, the magnetic field sensed by the magnetic field sensor 110 during the particular time interval is unambiguously associated with the particular magnetic field generator 120. Using FDM, driving currents having different distinct frequencies are concurrently applied to each of the multiple magnetic field generators 120. The corresponding magnetic fields generated by the multiple magnetic field generators 120 are distinguishable from each other because of the different frequencies of the driving currents applied to different magnetic field generators 120. In a FDM implementation, the magnetic field detected by a magnetic field sensor 110 includes multiple distinct frequency elements, each frequency element unambiguously associated a different emitting magnetic field generator 120.

As illustrated in FIG. 1D for magnetic field generator (MG) 120 with reference to magnetic field sensor (MS) 110, a spatial position vector (V) including the Cartesian distances (x, y, z) and angular orientations (α, φ, ψ), can be computed based on the signals detected by the magnetic field sensor 110 responsive to the magnetic fields (Hx, Hy, Hz) generated by magnetic field generator 120.

In some embodiments, in a 3D coordinate system, spatial ambiguity in positions in the 3D sensor space (further explained above in conjunction with FIG. 1B) is resolved by performing 2D projections from the 3D space to a 2D magnetic field space. This 2D projection involves three unknown rotation angles and can be mathematically indicated as below:

$$T_{R,P,Y} H = T_{R,P,Y} \begin{pmatrix} H_x \\ H_y \\ H_z \end{pmatrix} = \begin{pmatrix} H_r \\ H_0 \\ 0 \end{pmatrix} = \begin{pmatrix} M \cos\theta / 2\pi r^3 \\ M \sin\theta / 4\pi r^3 \\ 0 \end{pmatrix} \quad (12)$$

where H is a sensor vector and $T_{R,P,Y}$ is a rotation matrix with three unknown variables R (Raw), P (Pitch) and Y (Yaw) corresponding to angular orientations (α, φ, ψ), to project the 3D sensor space to the 2D magnetic-field space. As equation (12) is an under-constrained system, there are three equations ($H_x$, $H_y$, $H_z$) for determining five unknown variables (R, P, Y, r, θ). In some embodiments, a searching process that determines a global optimal solution is used to solve for the unknown variables (e.g., R, P, Y).

Figure 2:
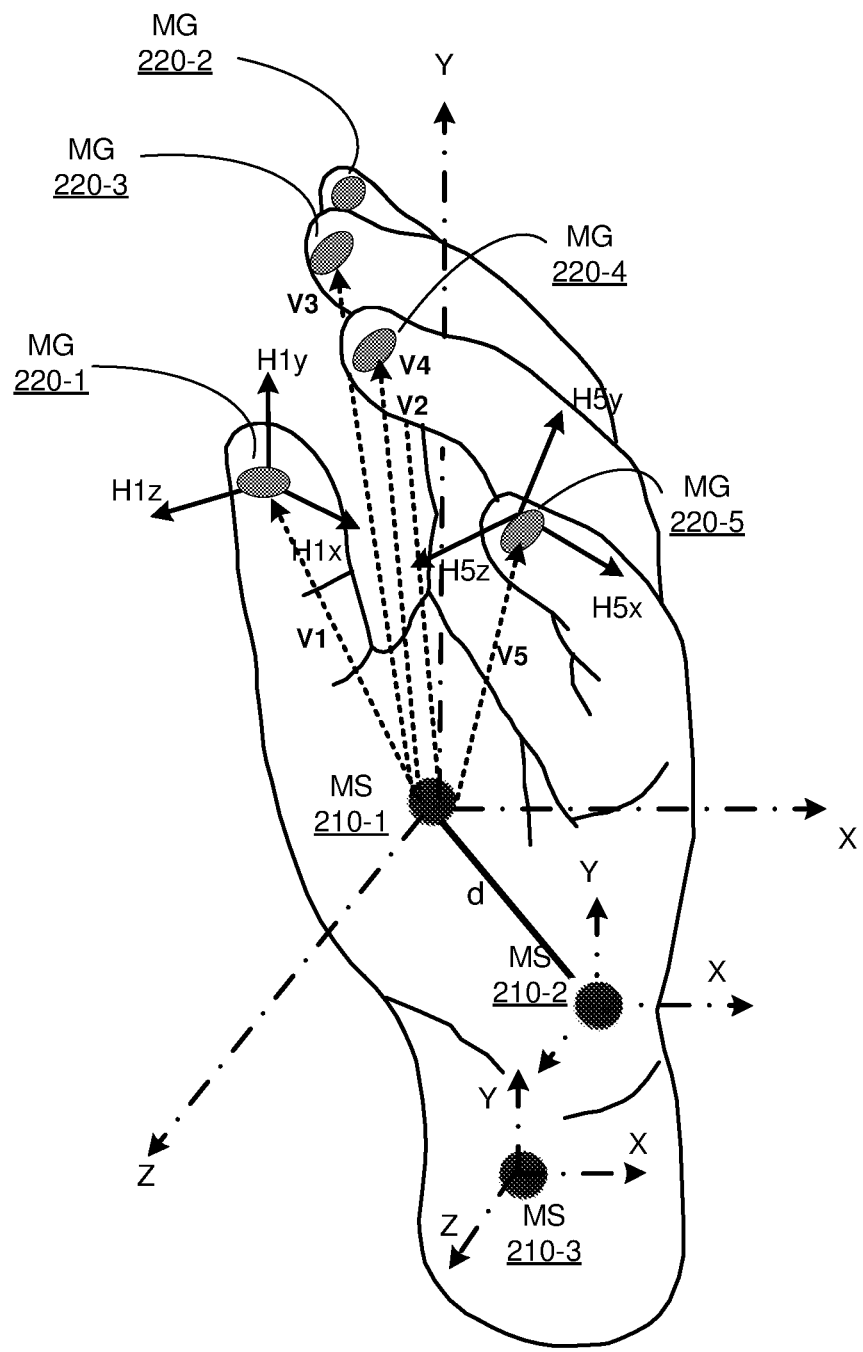
FIG. 2 illustrates locations of magnetic field sensors and magnetic field generators in relation to a wearable glove device on a hand of a user, where a plurality of magnetic field generators are positioned on different fingers, and are coupled to magnetic field sensors at known locations, in accordance with one or more embodiments.

FIG. 2 illustrates locations of multiple magnetic field generators (MG) 220-1, 220-2, 220-3, 220-4, 220-5 on different fingers of a user's hand, and a three-axis magnetic field sensor 210-1 located on the palm of the user's hand, and a three-axis magnetic field sensor MS 210-2 located on the palm of the user's hand at a known distance, d, from magnetic field sensor MS 210-1, as well as another three-axis magnetic field sensor MS 210-3 that is located near the wrist of the user's hand. In this configuration, the three-axis magnetic field sensor MS 210-1 and the other three-axis magnetic field sensor MS 210-2 have a known distance and angle relative to each other and do not experience rotational or translation movement relative to each other, allowing the three axis magnetic field sensor MS 210-1 and the other three-axis magnetic field sensor MS 210-2 to determine positions of magnetic field generators MG 220-1, 220-2, 220-3, 220-4, 220-5 as proxy locations of tracked points using triangulation. Thus, the described configuration allows determination of the distance and angle of each of the magnetic field generators MG 220-1, 220-2, 220-3, 220-4, 220-5 with respect to either or both of the magnetic field sensors MS 210-1 and MS 210-2. In some embodiments, the three-axis magnetic field sensor MS 210-1 and the other three-axis magnetic field sensor MS 210-2 are positioned on a user's hand so one of the three-axis magnetic field sensors MS 210-1 is located on the palm of the user's hand at less than a threshold distance from the fingers on the palm of the user's hand, while the other three-axis magnetic field sensor MS 210-2 is located on the palm of the user's hand at less than a threshold distance from the user's wrist. Such a configuration of the magnetic field sensors MS 210-1 and 210-2 provides an improved r signal to noise ratio when calculating positions of the magnetic field generators MG 220-1, 220-2, 220-3, 220-4, 220-5 using triangulation. In some embodiments, the two magnetic field sensors MS 210-1 and MS 210-2 are poisoned diagonally across the palm of the user's hand from each other, as shown in FIG. 2. In some embodiments, a transceiver comprising a three-axis magnetic field sensor and a single axis magnetic field generator is used in place of one or more of magnetic field sensor MS 210-1, 210-2. In these embodiments, the three-axis magnetic field sensor MS 210-3 that is located at the wrist of the user's hand may be used to determine the position of the tracked location of the transceiver positioned at a location of magnetic field sensor 210-1 or of magnetic field sensor 210-2, providing information about the relative palm position, also termed the "hand position," relative to the user's wrist. In some embodiments, the magnetic field generators located at the fingers 220-1, 220-2, 220-3, 220-4, and 220-5 may also be used to determine the "hand position" in a configuration where two three-axis magnetic field sensors are located at the user's wrist. In some embodiments, the magnetic field sensors MS 210-1, MS 220-2, and MS 210-3, and the magnetic field generators 220-1, 220-2, 220-3, 220-4, and 220-5, as shown in FIG. 2, are coupled to or included within a wearable glove to be worn on the user's hand.

In some embodiments, as further described above in conjunction with FIGS. 1A-1D, the magnetic field sensors MS 210-1, MS 210-2, and MS 210-3 include one or more sensing elements. For example, the magnetic field sensors may include a plurality of sensing elements having pre-defined, known, or solvable relative positions, as further described above with reference to sensing elements S1, S2, S3, and S4 of the coordinate system 130 of FIG. 1C.

In some embodiments, each of the magnetic field generators 220-1, 220-2, 220-3, 220-4, 220-5, as shown in FIG. 2 are single axis magnetic field generators. These magnetic field generators may each be an actively driven transmitter using alternating current signals to generate the magnetic fields, such as an electromagnet. In some embodiments, when the magnetic field generator is located in combination with the magnetic field sensor as part of a transceiver, the magnetic field generator may be an actively driven single axis transmitter. In alternative embodiments, a single magnetic field generator may include one or more programmable magnets (e.g., polymagnets) with programmable, controllable, and/or reconfigurable magnetic properties. In some embodiments, each magnetic field generator, 220-1, 220-2, 220-3, 220-4, 220-5, includes one or more electromagnets that can be independently actuated based on current provided through a current carrying coil to generate directional magnetic field components (H1$x$, H1$y$, H1$z$; . . . , H5$x$, H5$y$, H5$z$;). The magnetic fields for each of the magnetic field generators 220-1, 220-2, 220-3, 220-4, 220-5 can also be expressed as vector components (Hr and Hθ) as described above in conjunction with FIGS. 1A-1B.

Furthermore, in embodiments where the magnetic field generators 220-1, 220-2, 220-3, 220-4, 220-5 are actively driven transmitters, such as electromagnets, as noted previously, the magnetic fields generated by each electromagnet may be distinguished from magnetic fields generated by the other electromagnets by controlling one or more attributes (e.g., frequency, timing, modulation codes/patterns) of the stimulating current provided to different electromagnets. For example, each electromagnet may be stimulated at a different frequency for disambiguation (based on frequency division multiplexing) from other electromagnets. Accordingly, signals detected by the magnetic field sensor 210 are uniquely associated with a particular electromagnet based on a detected frequency of the signals. Alternatively, each electromagnet may be stimulated at a different time for disambiguation (e.g., time division multiplexing with a common frequency) from other electromagnets. Accordingly, signals detected by the magnetic field sensor MS 210-1 and the other magnetic field sensor MS 210-2 may be uniquely associated with a particular electromagnet based on a time interval when the magnetic field sensor MS 210-1 or the other magnetic field sensor MS 210-2 detected the signals.

In the example of FIG. 2, one or more magnetic field generators 220-1, 220-2, 220-3, 220-4, 220-5 are positioned on tracked points at one or more fingertips of a hand, magnetic field sensors MS 210-1 and MS 210-2 are at predefined locations (e.g., at the palm of the hand as shown, at a fixed distance from each other), and another magnetic field sensor 210-3 is positioned at another predefined location (e.g., at the wrist of the hand). The magnetic field sensor MS 210-1 outputs a signal (or combination of signals) responsive to magnetic fields generated by each magnetic field generator 220-1, 220-2, 220-3, 220-4, 220-5 detected by the magnetic field sensor MS 210-1. Spatial position vectors V1, V2, . . . , V5 are computed, as described with reference to FIGS. 1C and 1D above, from the signal output by the magnetic field sensor MS 210-1, in response to magnetic fields generated by various magnetic field generators 220-1, 220-2, 220-3, 220-4, 220-5. For example, spatial position vector V1 corresponds to an output from the magnetic field sensor MS 210-1 based on a magnetic field generated by magnetic field generator 220-1; similarly, spatial position vectors V2, V3, V4, V5 correspond to outputs from the magnetic field sensor MS 210-1 based on a magnetic field generated by magnetic field generators 220-2, 220-3, 220-4, and 220-5, respectively. The computed spatial position vectors V1, V2, . . . , V5 are used to determine the position of each of the corresponding magnetic field generators 220-1, 220-2, 220-3, 220-4, 220-5, relative to the location of the magnetic field sensor MS 220-1. These positions are used as proxy positions for each of the corresponding different fingertips, with reference to the (known) position of the magnetic field sensor 210-1. Similarly, the other magnetic field sensor MS 210-2 outputs a signal (or combination of signals) responsive to magnetic fields generated by each magnetic field generator 220-1, 220-2, 220-3, 220-4, 220-5 detected by the other magnetic field sensor MS 210-2. Spatial position vectors V1', V2', . . . , V5' (not shown) are computed, as described with reference to FIGS. 1C and 1D above, from the signal output by the other magnetic field sensor MS 210-2 in response to magnetic fields generated by various magnetic field generators 220-1, 220-2, 220-3, 220-4, 220-5. The computed spatial position vectors V1', V2', . . . , V5' are used to determine the positions of each of the corresponding magnetic field generators 220-1, 220-2, 220-3, 220-4, 220-5, relative to the position of the other magnetic field sensor MS 210-2. These positions are used as proxy positions of each of the corresponding different fingertips, with reference to the (known) position of the other magnetic field sensor 210-2. Thus, having two magnetic field sensors located at the palm of the hand at a known fixed distance from each other enables determination of the positions of the tracked points using triangulation. Furthermore, if a magnetic field sensor is located at an HMD or at a nearby stationary known location, the locations of the tracked points may be determined relative to the HMD or the stationary location. In embodiments where the magnetic field sensor 210-3 is used to sense the magnetic field generated by a transceiver co-located on the palm with the magnetic field sensor 210-1 or with the other magnetic field sensor 210-2, the position of the tracked point on the palm may be determined with respect to the magnetic field sensor 210-3. In the embodiments described herein, the magnetic field sensors located on the palm, wrist, and the stationary locations, or otherwise, may be one-, two-, or three-axis sensors.

Hand Gesture and Hand Position Recognition

Figure 3A:
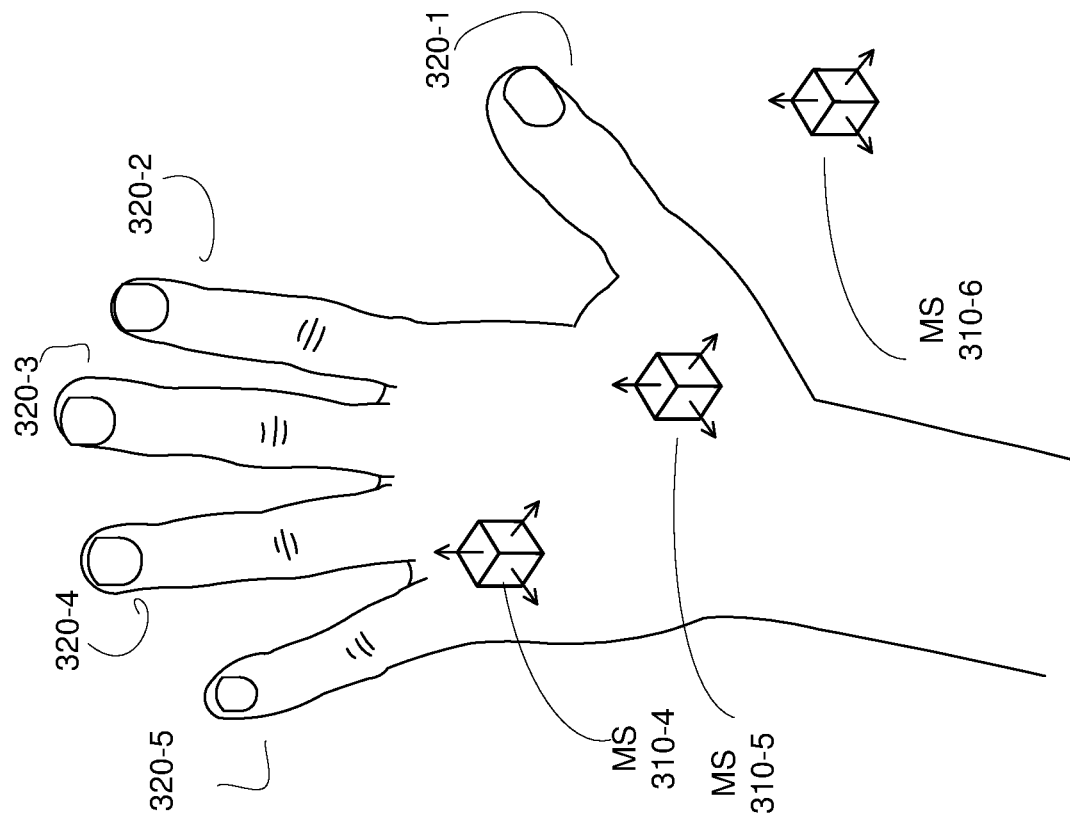
FIGS. 3A and 3B illustrate the positioning of the magnetic field generators to act as proxy locations for fingertip and finger section locations being tracked via magnetic field sensors, in accordance with one or more embodiments.
Figure 3B:
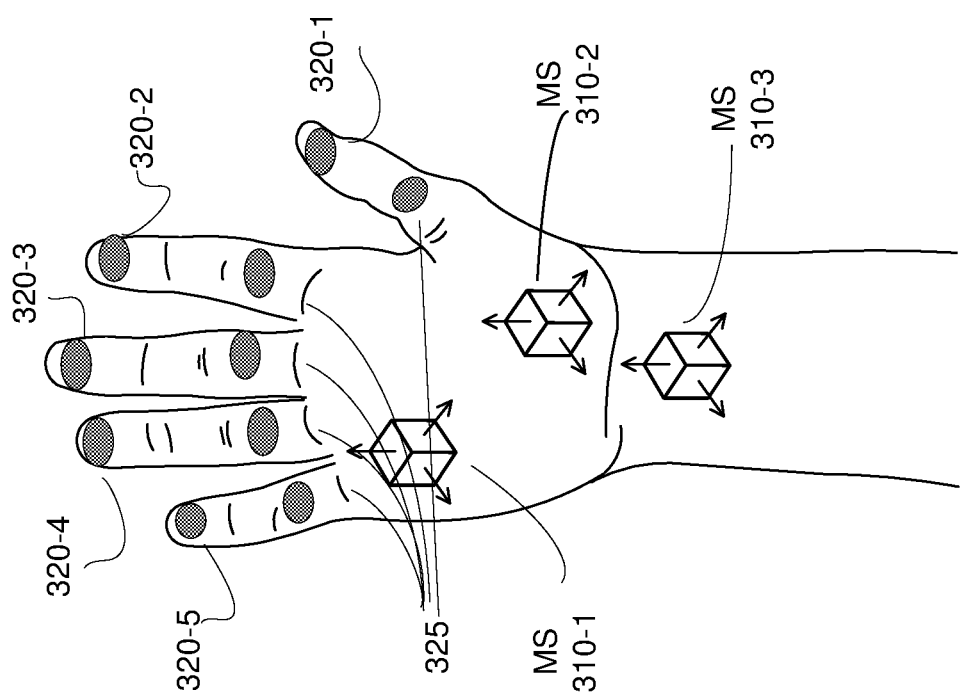

FIGS. 3A and FIG. 3B illustrate embodiments comprising multiple magnetic field generators and multiple magnetic field sensors. As shown in FIG. 3A, magnetic field generators 320-1, 320-2, 320-3, 320-4, 320-5 are located near the fingertips of a hand, so determined positions for magnetic field generators 320-1, 320-2, 320-3, 320-4, 320-5 act as proxies for positions of the fingertips near which magnetic field generators 320-1, 320-2, 320-3, 320-4, 320-5 are located. In some embodiments, the magnetic field generators 320-1, 320-2, 320-3, 320-4, 320-5 are single-axis magnetic field generators, generating magnetic fields along a single axis of a known coordinate system. In some embodiments, each of the magnetic field generators may employ FDM, using stimulating currents of different frequencies. In some embodiments, the magnetic field generators may employ TDM, using stimulating currents of a single frequency applied sequentially across the magnetic field generators 320-1, 320-2, 320-3, 320-4, 320-5.

Magnetic field sensor 310-1 senses the magnetic fields transmitted by the magnetic field generators 320-1, 320-2, 320-3, 320-4, 320-5. In some embodiments, the magnetic field sensor 310-1 is a three-axis receiver. Similarly, magnetic field sensor 310-2 senses the magnetic fields transmitted by the magnetic field generators 320-1, 320-2, 320-3, 320-4, 320-5, and in some embodiments, may be a three-axis receiver. As shown in the example of FIG. 3A, the magnetic field sensor 310-1 is located at or near the palm of the hand in a predetermined position; however, in other embodiments, the magnetic field sensor 310-1 may be located at any suitable predetermined location. Magnetic field sensor 310-2 is located at a fixed known position relation to magnetic field sensor 310-1. In various embodiments, the three-axis magnetic field sensor MS 310-1 and the other three-axis magnetic field sensor MS 310-2 are positioned so one of the three-axis magnetic field sensors MS 310-1 is located on the palm of the user's hand at less than a threshold distance from the fingers on the palm of the user's hand, while the other three-axis magnetic field sensor MS 310-2 is located on the palm of the user's hand at less than a threshold distance from the user's wrist. Such positioning of the magnetic field sensors MS 310-1 and 310-2 improves a signal to noise ratio when calculating positions of the magnetic field generators 320-1, 320-2, 320-3, 320-4, 320-5 using triangulation. As depicted in FIG. 3A, the magnetic field sensor 310-3 is located at or near the wrist of the hand in a predetermined position; however, in other embodiments, the magnetic field sensor 310-3 may be located at any suitable predetermined position. In some embodiments, the magnetic field generators 320-1, 320-2, 320-3, 320-4, 320-5, and the magnetic field sensors 310-1, 310-2, and 310-3 are coupled to a wearable glove device configured to be worn around the hand of a user.

In the example of FIG. 3A, in alternative embodiments, additional field generators 325 may be additionally located at or near a middle of the lower section of the fingers on a user's hand, such as shown in FIG. 3A. This placement of the additional magnetic field generators 325 allows determination of information describing bending of the individual fingers relative to the magnetic field sensors 310-1, 310-2. Similar to the magnetic field generators 320-1, 320-2, 320-3, 320-4, 320-5, the additional field generators 325 may also be coupled to a wearable glove device configured to be worn around the user's hand. In some embodiments, magnetic field generators may be located at various locations of a user's body corresponding to points being tracked.

FIG. 3B depicts the back of the palm of the user's hand in the embodiment shown in FIG. 3A. As shown in FIG. 3B, magnetic field sensors 310-4 and 310-5 are in an alternate configuration at a known or predetermined location on a dorsal aspect of the user's hand (i.e., the back of the palm) instead of on the palm as depicted in FIG. 3A with magnetic field sensors 310-1 and 310-2. The magnetic field sensors 310-4 and 310-5 are at a fixed known distance from each other, and they sense the magnetic field generated by the magnetic field generators 320-1, 320-2, 320-3, 320-4, 320-5. In some embodiments, the magnetic field sensors 310-4 and 310-5 may be a three-axis receiver, such as a three-axis magnetometer. The magnetic field sensors 310-4 and 310-5 may be coupled to a wearable glove device configured to be worn around the hand for a user.

As further described above in conjunction with FIGS. 1A-1D and 2, the depicted configurations in FIGS. 3A and 3B allow determination of the positions of the magnetic field generators 320-1, 320-2, 320-3, 320-4, 320-5 as proxy locations for tracked points. For example, using the magnetic fields sensed by the magnetic field sensors 310-1 and 310-2, and the known location of magnetic field sensor 310-2 with respect to magnetic field sensor 310-1 (as shown in FIG. 3A) positions of the magnetic field generators 320-1, 320-2, 320-3, 320-4, 320-5 are determined. As another example, using the magnetic fields sensed by the magnetic field sensors 310-4 and 310-5, and the known location of magnetic field sensor 310-5 with respect to magnetic field sensor 310-4 (as shown in FIG. 3B) positions of the magnetic field generators 320-1, 320-2, 320-3, 320-4, 320-5 are determined. Having magnetic field sensors located both on the palm of the hand as well as additionally on the dorsal aspect of the hand may be used to improve the accuracy of the location values determined for the tracked points.

FIG. 3A also depicts a magnetic field sensor 310-3 that is located at the wrist. As described above in conjunction with FIG. 2, magnetic field sensor 310-3 facilitates a determination of the position of a tracked point on the palm with respect to the wrist when there is a magnetic field generator located on the palm of the user. In some embodiments, the magnetic field sensor 310-1 is included in a transceiver that includes the magnetic field sensor 310-1 and a magnetic field generator on the palm. The magnetic field sensed by magnetic field sensor 310-3 may be used to determine the palm or hand position based on the tracked point of the transceiver including the magnetic field sensor 310-1. FIG. 3B shows magnetic field sensor 310-6 at a known location separate from the user's hand or wrist, such as on a head mounted display or other known stationary location separate from the user's hand or wrist. This positioning of the magnetic field sensor 310-6 allows determination of positions of tracked points relative to the location of magnetic field sensor 310-6.

In embodiments performing continuous tracking, the determined positions of the magnetic field generators 320-1, 320-2, 320-3, 320-4, 320-5 may be further refined by employing a Kalman filter to mitigate statistical noise and other inaccuracies in output signals from the magnetic field sensors 310-1 and 310-2. A Kalman filter employs a noise model along with (i) prior estimates of the positions of the magnetic field generators 320-1, 320-2, 320-3, 320-4, 320-5, and (ii) current estimates of the position values of the magnetic field generators 320-1, 320-2, 320-3, 320-4, 320-5 as determined based on current magnetic field sensor readings 310-1 and 310-2, in order to obtain a best estimate of the positions of each of the magnetic field generator 320-1, 320-2, 320-3, 320-4, 320-5. Furthermore, the Kalman filter generates an uncertainty covariance matrix that is associated with the best estimate of current positions of the magnetic field generators 320-1, 320-2, 320-2, 320-3, 320-4, 320-5. Under an assumption that the determined position of each magnetic field generator 320-1, 320-2, 320-2, 320-3, 320-4, 320-5 is an independent value computed from readings from the magnetic field sensors 310-1 and 310-2 and that there is no correlation between the individual magnetic field generator 320-1, 320-2, 320-2, 320-3, 320-4, 320-5 position estimates, the uncertainty covariance matrix is a diagonal matrix, with each diagonal value reflecting a variance in the best estimate of the corresponding magnetic field generator's position. The uncertainty covariance matrix associated with the best estimate of the positions of the magnetic field generator 320-1, 320-2, 320-2, 320-3, 320-4, 320-5 may then be used to establish confidence intervals around each best estimate of the positions of the magnetic field generators 320-1, 320-2, 320-2, 320-3, 320-4, 320-5. In some embodiments, the noise model employed by the Kalman filter describes noise as a function of distance between the magnetic field sensor 310-1 and the magnetic field generators 320-1, 320-2, 320-2, 320-3, 320-4, 320-5 or distance between the additional magnetic field sensor 310-2 and magnetic field generators 320-1, 320-2, 320-2, 320-3, 320-4, 320-5. These embodiments may be part of fingertip tracking systems, where the magnetic field sensor 310-1 and the additional magnetic field sensor 320-2 may continuously sense magnetic fields emitted by the magnetic field generators 320-1, 320-2, 320-3, 320-4, 320-5 and continuously estimate positions of the magnetic field generators 320-1, 320-2, 320-3, 320-4, 320-5 from the sensed magnetic fields.

In embodiments performing continuous tracking, the Kalman filter approach described above may also be employed to determine positions of the user's palm with respect to the additional magnetic field sensor 310-3, positioned on the user's wrist in the example shown by FIG. 3A. A Kalman filter employs a noise model along with (i) prior estimates of a palm position, and (ii) a palm position as determined based on current magnetic field sensor readings from the magnetic field sensor 310-3 to obtain a best estimate of the palm position with respect to the magnetic field sensor 310-3. As further described above, the Kalman filter generates a variance value at each point in time reflecting the uncertainty in the best estimate of the palm position at that point in time. The variance value may then be used to establish a confidence interval around each best estimate of the palm position.

Similarly, the Kalman filter approach described above may be employed to determine positions of tracked points on the user's hand with respect to a magnetic field sensor 310-6 located separate from the user's hand, such as on a HMD or at a stationary location. A Kalman filter employs a noise model along with (i) prior estimates of the tracked points, and (ii) current estimates of the tracked points as determined based on current magnetic field readings from magnetic field sensor 310-6, to obtain a best estimate of the tracked points with respect to the magnetic field sensor 310-6. As described above, the Kalman filter generates a variance value at each point in time reflecting the uncertainty in the best estimates of the tracked points at that point in time. The variance value may then be used to establish a confidence interval around each best estimate of a tracked point.

FIGS. 4A-4C depict example gestures that may be identified as described above in conjunction with FIGS. 1A-1D, 2, and 3A-3B. FIG. 4A depicts magnetic field generators 420-1, 420-2, 420-3, 420-4, 420-5 placed at fingertips of a user's hand, so that locations of the depicted magnetic field generators 420-1, 420-2, 420-3, 420-4, 420-5 act as proxy locations for the fingertip locations. In some embodiments, the magnetic field generators 420-1, 420-2, 420-3, 420-4, 420-5 may be single axis magnetic field generators that each transmit magnetic fields at different frequencies. In other embodiments, the magnetic field generators 420-1, 420-2, 420-3, 420-4, 420-5 may be single axis magnetic field generators that transmit magnetic fields using a common frequency that is time-multiplexed across different magnetic field generators 420-1, 420-2, 420-3, 420-4, 420-5.

In the examples of FIGS. 4A-4C, a state descriptor $L_i$, with $i=1, \ldots, 5$, represents determined positions (distance and angle value) of each fingertip of a user's hand, determined from positions of magnetic field generators 420-1, 420-2, 420-3, 420-4, 420-5 placed at fingertips of the user's hand, with respect to a chosen coordinate system. Thus, a five-dimensional vector, $L=(L_1, L_2, L_3, L_4, L_5)$, provides a state descriptor that represents the state of user's hand by positions of each of the five fingertips of the hand with respect to a coordinate system. Each representative state descriptor corresponds to a gesture that may be made by the user's hand. A gesture may be then represented by a set of values of the vector components $(L_1, L_2, L_3, L_4, L_5)$ of the state descriptor based on the determined values of the fingertip positions.

As explained previously, in embodiments where continuous tracking is performed, a noise model is used to refine positions of the tracked points, such as, for example, using a Kalman filter. Thus, at a current point in time, a current best estimate of each of the fingertip positions is obtained along with an associated confidence interval for each current best position estimate.

In some embodiments, the current best estimates of each of the fingertip positions may be combined to be represented by a state descriptor, $L=(L_1, L_2, L_3, L_4, L_5)$, $L_1, \ldots, L_5$ being the estimated individual fingertip positions. Consequently, the representative state descriptor at the point in time may be viewed as a best estimate state descriptor, with confidence intervals associated with each of the estimated fingertip positions. The best estimate state descriptor at a given point may be used to establish a gesture along with the confidence intervals associated with each of the estimated fingertip positions. In some embodiments, the confidence intervals associated with each of the estimated fingertip positions may be combined to establish a confidence interval for the combined state descriptor, i.e., for the established gesture.

In some embodiments, the current best estimates of each of the fingertip positions may be combined to be represented by a best estimate state descriptor, $L=(L_1, L_2, L_3, L_4, L_5)$ only when the confidence interval associated with each estimated fingertip positions is at least a threshold confidence interval value. The best estimate state descriptor may be used to establish a gesture with an associated threshold confidence interval value.

FIG. 4A shows gesture 441, which is represented by the following state descriptor:

$$L\_a=(L1\_a,L2\_a,L3\_a,L4\_a,L5\_a) \quad (13)$$

where $L1\_a$ epresents a position 420-1 of the fingertip of the user's thumb from the proxy position of magnetic field sensor; $L2\_a$ represents a position 420-2 of a fingertip of the user's index finger from the proxy position of the magnetic field sensor. Similarly, $L3\_a$ represents a position 420-3 of the fingertip of the user's middle finger from the proxy position of the magnetic field sensor; $L4\_a$ represents a position 420-4 of the fingertip of the user's ring finger from the proxy position of the magnetic field sensor; and $L5\_a$ represents a position 420-5 of the fingertip of the user's little finger from the proxy position of the magnetic field sensor, where all the positions are with respect to a particular coordinate system.

Similarly, FIG. 4B depicts a gesture 432 which is represented by the following representative state descriptor:

$$L\_b=(L1\_b,L2\_b,L3\_b,L4\_b,L5\_b)$$

where $L1\_b$, $L2\_b$, $L3\_b$, $L4\_b$, and $L5\_b$ represent the positions of the fingertip of the user's thumb, index finger, middle finger, ring finger, and little finger, respectively, determined by the proxy positions of the corresponding magnetic field sensors 420-1, 420-2, 420-3, 420-4, 420-5 for the respective fingertips. Similarly, FIG. 4C depicts gesture 443, which is similarly represented by a corresponding state descriptor having components representing positions of fingertips of the user's thumb, pointer finger, middle finger, ring finger, and little finger based on the proxy positions of magnetic field generators 420-1, 420-2, 420-3, 420-4, 420-5 on different fingertips.

FIG. 4D depicts a mapping table 425 storing a mapping of state descriptors 430 to descriptions of corresponding gestures 440. In the example of FIG. 4D, the mapping table 425 includes mappings for the gestures depicted in FIG. 4A-4C. Thus, state descriptor 431 is mapped to a description of gesture 441, and state descriptor 432 is mapped to a description of gesture 442. Similarly, state descriptor 433 is mapped to a description of gesture 443. The mapping table 425 may be generated and stored in in a database for access and retrieval by a system coupled to the wearable glove device to determine hand gestures made by a user of the wearable glove device. In some embodiments, such a mapping table of state descriptors and corresponding descriptions of gestures may be experimentally determined based on a representative sample of users and stored in the system. A user of the wearable glove device may perform one or more actions corresponding to different gestures in various embodiments, allowing the user to interact with content presented by the system or to perform different actions via the wearable glove device based on gestures identified from the mapping table 425.

In accordance with some embodiments, output signals from the plurality of magnetic field sensors are processed to determine the fingertip positions from proxy locations of magnetic field generators 420-1, 420-2, 420-2, 420-4, 420-5. A state descriptor is used to represent the fingertip positions. This state descriptor is subsequently compared to state descriptors in the mapping table 425 to establish a gesture corresponding to the determined locations of the user's fingertips. When the comparison of the representative state descriptor to the state descriptors in the mapping table yields at least a threshold similarity with a particular state descriptor, the stored gesture corresponding to the particular state descriptor in the mapping table is established as the gesture corresponding to the fingertip positions made by the user of the wearable glove device.

In embodiments where a noise model is used to refine determined fingertip positions from proxy positions of magnetic field generators 420-1, 420-2, 420-2, 420-4, 420-5 (e.g., embodiments using a Kalman filter, as further described above) the current best estimate of each of the fingertip positions is obtained along with an associated confidence measure corresponding to each of the fingertip positions from proxy positions of magnetic field generators 420-1, 420-2, 420-2, 420-4, 420-5. In these embodiments, when the confidence measure associated with each of the estimated fingertip positions is at least a threshold confidence value, the estimated fingertip locations are represented by the current best estimate state descriptor; hence, the current best estimate state descriptor includes estimated fingertip positions that each have at least the threshold confidence value. The current best estimate state descriptor is then compared to state descriptors in the mapping table 425 to establish a gesture corresponding to the determined positions of the user's fingertips, where an established gesture has a state descriptor having at least a threshold measure of similarity to the current best estimate state descriptor.

System Architecture

Figure 5:
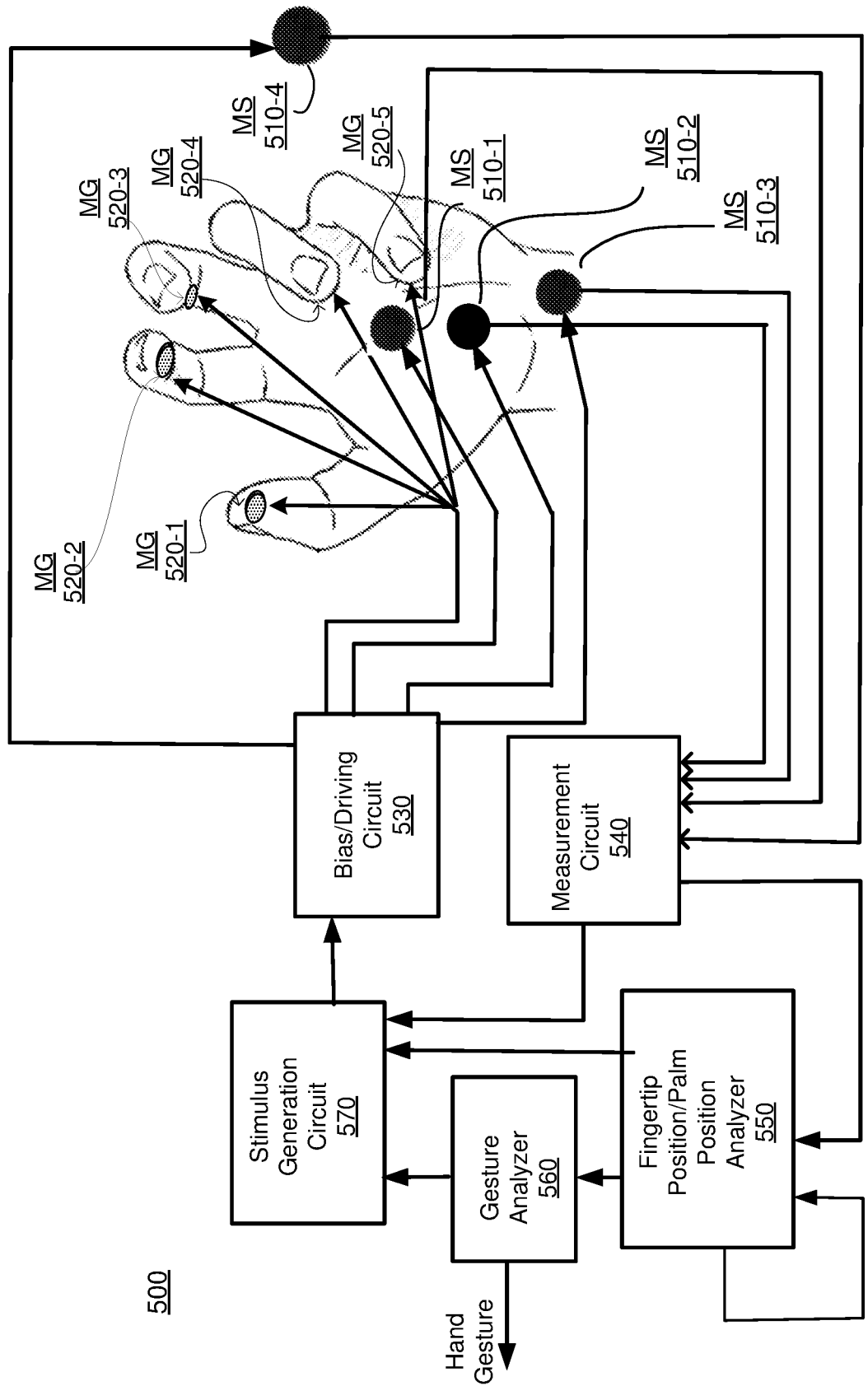
FIG. 5 is a block diagram of a system for determining hand gestures and hand positions made by a user using a wearable glove device, in accordance with one or more embodiments.

FIG. 5 illustrates one embodiment of a system 500 for determining hand gestures made by a user using a wearable glove device with magnetic field generators 520-1, 520-2, 520-3, 520-4, 520-5 located at the fingertips, a magnetic field sensor 510-1 located on the palm of the glove device, and an additional magnetic field sensor 510-2 located at a known fixed position from the magnetic field sensor 510-1 on the palm of the hand of the wearable glove device. Alternatively, instead of magnetic field sensors 510-1, 510-2 located on the palm of the user's hand, a similar configuration of magnetic field sensors may be located on the dorsal aspect of the user's hand (i.e., on the back of the user's hand) (not shown). In other embodiments, the magnetic field sensors 510-1, 510-2 are included on the palm, while other magnetic field sensors are included on the dorsal aspect of the palm to improve the accuracy of the determined positions of the tracked points. In some embodiments, an additional magnetic field sensor 510-3 is located on the wrist. In these embodiments, one or both of the magnetic field sensors on the palm, 510-1 and 510-2, are included in transceivers that also include magnetic field generators (not shown), so positions of the transceivers act as proxy locations for the tracked positions on the palm with respect to the additional magnetic field sensor 510-3. In some embodiments, another magnetic field sensor 510-4 is located separate from the wearable glove device (e.g., on a head mounted display or at a nearby stationary location). While FIG. 5 shows an example of a wearable glove device, in other embodiments, the system 500 described in conjunction with FIG. 5 may be implemented using any garment configured to be worn by a user over a portion of the user's body; example garments include a sleeve, a shoe, and a bracelet. The magnetic field generators 520-1, 520-2, 520-3, 520-4, 520-5 may be positioned in or on a garment to be positioned at specific locations of portions of a user's body, so locations of the magnetic field generators 520-1, 520-2, 520-3, 520-4, 520-5 act as proxy locations for corresponding portions of the user's body that are being tracked by the system 500. Similarly, the magnetic field sensors 510-1 and 510-2 may have any suitable positions, provided the positions of the magnetic field sensor 510-1 and the additional magnetic field sensor 510-2 have fixed and known positions relative to each other. In various embodiments, the system environment 500 may include different or additional components than those described in conjunction with FIG. 5. Additionally, functionality provided by different components described below in conjunction with FIG. 5 may be differently allocated among various components of the system 500 in some embodiments.

In the example of FIG. 5, a wearable glove device is coupled to or includes multiple (e.g., five) magnetic field generators, 520-1, 520-2, 520-3, 520-4, 520-5; the example of FIG. 5 has different magnetic field generators corresponding to each of the five fingers of a user's hand. However, in other embodiments, the system 500 may include any number of magnetic field generators (such as shown in FIG. 3A at the joints of the fingers with the palm) that may be located at the wrist, forearm, and other portions of a user's body. FIG. 5 also depicts the wearable glove device is coupled to or includes the magnetic field sensor 510-1 and the additional magnetic field sensor 510-2, as further described above in conjunction with FIGS. 2, 3A, and 3B. The magnetic field sensor 510-1 and the additional magnetic field sensor 510-2 are located at predetermined and known locations relative to each other in some chosen coordinate system. In various embodiments, the system 500 may include additional sensors (not shown) such as inertial measurement sensors, such as accelerometers and gyroscopes, as well as haptic feedback mechanisms.

The system 500 also includes a bias/driving circuit 530 for providing bias signals (such as power and other operating signals) and driving signals (such as stimulating/driving currents and voltages) to the magnetic field generators 520-1, 520-2, 520-3, 520-4, 520-5, and to the magnetic field sensors, 510-1 and 510-2 (and 510-3 and 510-4, if present). Driving signals provided to each magnetic field generator 520-1, 520-2, 520-3, 520-4, 520-5 may be disambiguated from the corresponding driving signals provided to other magnetic field generators 520-1, 520-2, 520-3, 520-4, 520-5 based on attributes such as frequency, timing, modulation codes, modulation patterns, or any other suitable information.

A measurement circuit 540 processes the output signals received from the magnetic field sensor 510-1 and from the additional magnetic field sensor 510-2 (and 510-3 and 510-4, if present). For example, the measurement circuit 540 may filter, amplify, or perform other suitable operations on the output signals from the magnetic field sensors 510-1, 510-2 (and 510-3 and 510-4, if present).

In some embodiments, the magnetic field sensor 510-1 and the magnetic field sensor 510-2, each include a sensing element that is resonant to certain frequencies and may be tuned to respond to those frequencies. This allows the magnetic field sensors 510-1 and the additional magnetic field sensor 510-2 to detect magnetic fields generated by different magnetic field generators 520-1, 520-2, 520-3, 520-4, 520-5 that use different frequencies to generate magnetic fields or that generate magnetic fields via common frequency at different times. In other embodiments, the magnetic field sensor 510-1 and the additional magnetic field sensor 510-2 do not include a sensing element tuned to particular frequencies at which different magnetic field generators 520-1, 520-2, 520-3, 520-4, 520-5 generate magnetic fields; in these embodiments, the measurement circuit 540 includes a fast Fourier transformation (FFT) convolution filter that decomposes a single composite signal output by the magnetic field sensor 510-1 or by the additional magnetic field sensor 510-2 into a set of directional frequency components corresponding to frequencies at which different individual magnetic field generators 520-1, 520-2, 520-3, 520-4, 520-5 generate magnetic fields. Thus, for example, the FFT convolution filter decomposes an output signal H from the magnetic field sensor 510-1 into a set of directional frequency components, $H^1_j(x,y,z)=(H^1x_j, H^1y_j, H^1z_j)$, for j=1 . . . 5, for each of the magnetic field generators 520-1, 520-2, 520-3, 520-4, 520-5, with respect to a chosen global coordinate system. Similarly, the FFT convolution filter decomposes an output signal H from the magnetic field sensor 510-2 into a set of directional frequency components, $H^2_j(x,y,z)=(H^2x_j, H^2y_j, H^2z_j)$, for j=1 . . . 5, for each of the magnetic field generators 520-1, 520-2, 520-3, 520-4, 520-5, with respect to a chosen global coordinate system.

The fingertip position/palm position analyzer 550 receives signals from the measurement circuit 540 and determines the position of each magnetic field generator 520-1, 520-2, 520-3, 520-4, 520-5 in a chosen coordinate system based on the signals from the measurement circuit 540. In various embodiments, the fingertip position/palm position analyzer 550 also determines the position of a magnetic field generator included in a transceiver that also includes a magnetic field sensor 510, with the position of the transceiver determined with respect to the additional magnetic field sensor 510-3. This position of the transceiver is used as a proxy position of the palm (where the transceiver including the magnetic field generator and the magnetic field sensor is located) with respect to the position of the additional magnetic field sensor (e.g., the position of the wrist when the magnetic field sensor 510-3 is located on the user's wrist). The fingertip position/palm position analyzer 550 also determines positions of any of the tracked points (as represented by proxy locations of corresponding magnetic field generators at those points) relative to a magnetic field sensor 510-4 that is located separate from the wearable glove device (e.g., on a head mounted display or at nearby stationary location). As further described above in conjunction with FIGS. 1A-1C, 2, and 3A-3B, the fingertip position/palm position analyzer 550 determines a position of a particular magnetic field generator 520-1, 520-2, 520-3, 520-4, 520-5 based on a computed strength of a magnetic field of the particular magnetic field generator 520-1, 520-2, 520-3, 520-4, 520-5 as detected by the magnetic field sensor 510-1 and the additional magnetic field sensor 510-2 based on signals received from the measurement circuit 540. In some embodiments, the fingertip position/palm position analyzer 550 uses a trained machine learning regression model to represent the field strength of the magnetic field generated by the particular magnetic field generator 520-1, 520-2, 520-3, 520-4, 520-5 and detected by the magnetic field sensor, 510-1 or by the additional magnetic field sensor 510-2, at a given time. In various embodiments, the trained machine learning regression model represents the field strength of detected magnetic field generated by the particular magnetic field generator 520-1, 520-2, 520-3, 520-4, 520-5 as a polynomial function of the relative distance between a pair of the magnetic field sensor 510-1 or the additional magnetic field sensor 510-2 and the particular magnetic field generator 520-1, 520-2, 520-3, 520-4, 520-5. The fingertip position/palm position analyzer 550 transmits the determined positions of each of the magnetic field generators 520-1, 520-2, 520-3, 520-4, 520-5 to the gesture analyzer 506. The determined positions of each of the magnetic field generators 520-1, 520-2, 520-3, 520-4, 520-5 are used as proxy positions for fingertip positions corresponding to fingertips where the magnetic field generators 520-1, 520-2, 520-3, 520-4, 520-5 are located on the wearable glove device.

In some embodiments, the system 500 dynamically tracks the positions of the magnetic field generators 520-1, 520-2, 520-3, 520-4, 520-5 over time. In these embodiments, the fingertip position/palm position analyzer 550 may include filters such as a Kalman filter to model noisy and incomplete sensor measurements. The Kalman filter employs a noise model along with prior position estimates of tracked points of the magnetic field generators 520-1, 520-2, 520-3, 520-4, 520-5 (received from the fingertip position analyzer/palm position 550) and signals from the measurement circuit 540 obtained at a current time to determine a current best position estimate for each of the fingertip locations. These estimates may be associated with confidence intervals providing a measure of confidence of the determined fingertip positions that accounts for noisy measurements by the magnetic field sensor 510-1 or by the additional magnetic field sensor 510-2.

The gesture analyzer 560 determines a particular gesture made by the fingers on the hand that is wearing the wearable glove device (or made by a portion of the user's body on which a wearable garment is worn) from the fingertip positions determined from the computed proxy positions of the magnetic field generators 520-1, 520-2, 520-3, 520-4, 520-5 located at tracked points on the fingertips of the user. The gesture analyzer 560 receives the fingertip positions from the fingertip position/palm position analyzer 550 and combines the fingertip positions to obtain a representative state descriptor that represents the state of the hand comprising the fingers as described above in conjunction with FIGS. 4A-4C. In embodiments, with noise modeling, as described previously, the state descriptor may be used to represent the fingertip positions only when the confidence interval for each determined fingertip position is at least a preestablished threshold confidence level. The gesture analyzer 560 subsequently uses the representative state descriptor having at least a threshold confidence level (e.g., for each determined fingertip positions) to identify a gesture. In some embodiments, when the estimated fingertip positions do not all have at least a threshold confidence level, a state descriptor may not be used to represent the estimated fingertip positions. In some embodiments, when the estimated fingertip positions do not each have at least a threshold confidence level, a state descriptor may be used to represent the estimated fingertip positions, with an associated confidence interval that may be determined based on a combination of the confidence intervals associated with each of the determined confidence levels of the fingertip positions, or with an confidence intervals represent by the lowest confidence interval from among the determined confidence levels of the fingertip locations.

The gesture analyzer 560 identifies a gesture corresponding to a representative state descriptor. In some embodiments, the gesture analyzer 560 uses the representative state descriptor and a stored mapping table, as further described above in conjunction with FIG. 4D. The mapping table may be generated and stored in in a database for access and retrieval by the gesture analyzer 560. In some embodiments, such a mapping table of state descriptors and corresponding descriptions of gestures may be experimentally determined based on a representative sample of users and stored. The gesture analyzer 560 performs a comparison of the representative state descriptor to state descriptors in the stored mapping table to establish a gesture corresponding to the representative state descriptor. When the comparison of the representative state descriptor to the state descriptors in the mapping table yields at least a threshold similarity with a particular state descriptor in the mapping table, the stored gesture corresponding to the particular state descriptor in the mapping table is established as the gesture corresponding to the fingertip locations made by the user of the wearable glove device. In some embodiments, the gesture analyzer 560 uses machine learning model trained on fingertip locations and a gesture knowledge base to label a representative state descriptor with a corresponding gesture description. In some embodiments, a confidence interval may be associated with a representative state descriptor based on confidence intervals for fingertip locations comprising the representative state descriptor. In such embodiments, the gesture analyzer 560 may associate a confidence interval in association with the established gesture corresponding to the representative state descriptor.

In one or more embodiments, the system 500 also includes a stimulus generation circuit 570 configured to generate signals that modify biasing and driving properties of the magnetic field sensor 510-1, the additional magnetic field sensor 510-2, the magnetic field sensors 510-3 and 510-4, if present, or the one or more magnetic field generators 520-1, 520-2, 520-3, 520-4, 520-5 based on output signals obtained from the magnetic field sensors 510-1, 510-2 (and 510-3, 510-4, if present). The stimulus generation circuit 570 may receive signals from one or more of: the fingertip location/palm position analyzer 550, the gesture analyzer 560, and the measurement circuit 540, and modify one or more properties of one or more of the magnetic field generators 520-1, 520-2, 520-3, 520-4, 520-5 based on the received signals.

Figure 6:
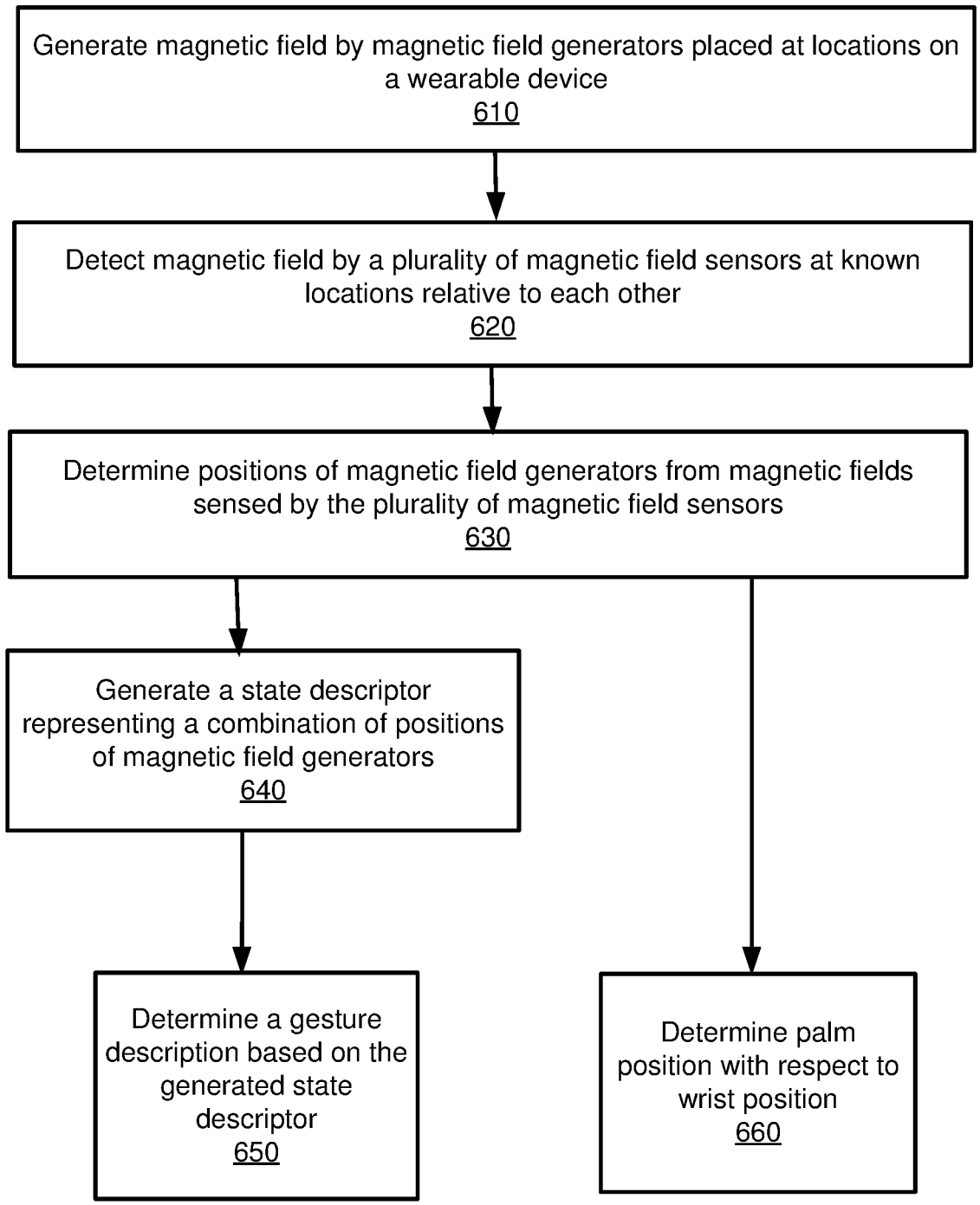
FIG. 6 is a flowchart of a method for determining a gesture from locations of magnetic field generators determined from magnetic fields sensed by magnetic field sensors, in accordance with one or more embodiments.

FIG. 6 is a flowchart of one embodiment of a method for determining relative palm positions and gestures made by a combination of tracked points based on proxy locations of magnetic field generators as determined from magnetic fields sensed by magnetic field sensors. In various embodiments, the method may include different or additional steps than those described below in conjunction with FIG. 6. Additionally, in some embodiments, steps of the method may be performed in different orders than the order described in conjunction with FIG. 6.

One or more magnetic field generators, such as those described above in conjunction with FIGS. 1-5, generate 610 one or more magnetic fields. The magnetic field generators are located at portions of a user's body that are being tracked or whose positions are to be determined with respect to a chosen coordinate system. For example, a magnetic field generator is located at a point on a portion of the user's finger and acts as a proxy location for that portion of the user's finger. Similarly, magnetic field generators may be positioned on other portions of a user's body to act as proxies for locations of the portions of the user's body. In one embodiment, different magnetic field generators generate 610 magnetic fields at different frequencies. Alternatively, different magnetic field generators generate 610 magnetic fields using a common frequency, but generate magnetic fields at different times. Frequencies at which magnetic fields are generated 610 by magnetic field generators may be determined using a variety of factors. In some embodiments, the generated frequencies are selected to reduce second-order harmonics and reduce interference between the magnetic fields generated 610 by different magnetic field generators.

A plurality of magnetic field sensors having known positions relative to each other detect 620 magnetic fields generated by the magnetic field generators. Examples of magnetic field sensors are further described above in conjunction with FIGS. 1-5. For example, the wearable device comprises a glove, and two magnetic field sensors are located on a palm of the glove device so that they are at a fixed known distance with respect to each other. Alternatively, the two magnetic field sensors may be located on a dorsal surface (i.e., the back of the palm) of the user's hand at a fixed known distance from each other. In another embodiment, a magnetic field sensor and an additional magnetic field sensor are positioned on a headset worn by the user and are separated by a known distance. Hence, the plurality of magnetic field sensors may be positioned separately from the wearable device that includes the magnetic field generators used for tracking points.

A plurality of magnetic field sensors are located at known fixed positions relative to each other. The plurality of magnetic field sensors detect 620 the generated magnetic fields and generate output signals based on the detected magnetic fields. An output signal generated by each of the magnetic field sensors is based on a strength and a direction of a magnetic field generated 610 by a magnetic field generator that is detected by a magnetic field sensor.

Output signals from the magnetic field sensors are processed (e.g., by the measurement circuit 540) to generate the directional frequency components corresponding to the frequencies used by different individual magnetic field generators to generate 610 magnetic fields. In some embodiments, an FFT filter is applied to an output signal from a magnetic field sensor to determine directional frequency components corresponding to frequencies used by different individual magnetic field generators.

From the directional frequency components and the known configuration of the two or more magnetic field sensors, positions of the magnetic field generators are determined 630 with respect to the magnetic field sensors, as further described above in conjunction with FIGS. 1A-3B. The positions of the magnetic field generators act as proxies for positions of body parts of the users where the magnetic field generators are located. For example, the wearable device is a glove with magnetic field generators positioned at fingertips of the glove, so determining 630 positions of the magnetic field generators determines positions of fingertips of the user with respect to a chosen coordinate system. In some embodiments with continuous tracking, a Kalman filter is used to estimate current positions of the fingertips along with a confidence interval that reflects the statistical uncertainty in the estimates.

From the determined fingertip positions, the gesture analyzer 560 generates 640 a state descriptor representing a combination of positions determined for different magnetic field generators. For example, magnetic field generators are located at fingertips of a user's hand, and the representative state descriptor identifies positions of each of the user's fingertips from the determined positions of the magnetic field generators. As further described above in conjunction with FIGS. 4 and 5, the state descriptor may include a confidence interval corresponding to each estimated position.

The gesture analyzer 560 determines 650 a description of a gesture corresponding to the generated state descriptor by comparing the state descriptor to previously stored state descriptors corresponding to different gestures. In some embodiments, the gesture analyzer 560 applies a machine learning model trained on prior magnetic field generator positions and a gesture knowledge base to determine 650 a gesture corresponding to the generated state descriptor. In some embodiments, where a mapping table stores a set of descriptions of gestures and corresponding state descriptors, the gesture analyzer 560 determines 650 a gesture description corresponding to the generated state descriptor by comparing the generated state descriptor to state descriptors stored in the mapping table. A stored state descriptor having at least a threshold measure of similarity to the generated state descriptor is used to determine the gesture description 650 corresponding to the generated state descriptor.

As described above with respect to FIGS. 2-5, in some embodiments, a magnetic field generator may be located on a palm of a wearable glove device to act as a proxy location for the palm of the user's hand. In these embodiments, a magnetic field sensor may be located at a known position on the wrist of the wearable glove device. Output signals from a magnetic field sensor positioned on a user's wrist, or other location, sensing magnetic fields generated by the magnetic field generator r may be used to determine 660 the position determined for the magnetic field generator located on the palm as a proxy for the location of the tracked point on the palm.

In various embodiments, the determined gesture description and palm position is provided to a display device, which renders a visual representation of the gesture description or the palm position. For example, the display device modifies a graphical representation of a user's hand based on a determined description of a user's hand gesture and the palm position. Alternatively or additionally, the determined gesture description is provided to a feedback mechanism that provides haptic feedback to a portion of the user's body contacting the magnetic field generators based on the determined gesture description. In other embodiments, a system coupled to the wearable device identifies an action (e.g., navigating a menu, pausing presentation of content, altering presentation of content) corresponding to the determined gesture description and performs the action corresponding to the determined gesture description In one or more embodiments, the disclosed systems and methods for determining hand gestures are used in conjunction with a virtual reality (VR), augmented reality (AR), or mixed reality (MR) system. For example, the disclosed methods for detecting locations of fingers or other body parts proximate to magnetic field generators are provide information about a state of a body part (e.g., a finger) of a user proximate to a magnetic field generator for rendering in a virtual environment. Additionally, such a system may perform one or more actions corresponding to determined locations of fingers or other body parts of a user proximate to a magnetic field generator determined as further described above.

Additional Considerations

The figures depict various embodiments of the present invention for purposes of illustration only. One skilled in the art will readily recognize from the following discussion that alternative embodiments of the structures and methods illustrated herein may be employed without departing from the principles of the invention described herein.

The foregoing description of the embodiments has been presented for the purpose of illustration; it is not intended to be exhaustive or to limit the embodiments to the precise forms disclosed. Persons skilled in the relevant art can appreciate that many modifications and variations are possible in light of the above disclosure.

Embodiments of the present disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereoscopic, or "stereo," video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a headset, a head-mounted display (HMD) connected to a host computer system, a standalone HMD, a near-eye display (NED), a mobile device or computing system, or any other hardware platform capable of providing artificial reality content to one or more viewers.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Some embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Some embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the embodiments be limited not by this detailed description, but rather by any claims that issue on an application based hereon. Accordingly, the disclosure of the embodiments is intended to be illustrative, but not limiting, of the scope of the embodiments, which is set forth in the following claims.

What is claimed is:

1. A system comprising:
    a processor;
    a plurality of magnetic field generators coupled to the processor, each magnetic field generator configured to generate a magnetic field using a distinct frequency;
    a plurality of magnetic field sensors coupled to the processor, each magnetic field sensor placed at a predetermined fixed position relative to another magnetic field sensor, each magnetic field sensor configured to detect magnetic fields generated by at least a set of the plurality of magnetic field generators and configured to generate an output signal based on strengths and directions of the detected magnetic fields;
    a measurement circuit coupled to each of the plurality of magnetic field sensors, the measurement circuit configured to:
    receive the output signal from each of the plurality of magnetic field sensors;
    determine directional frequency components corresponding to each of the plurality of magnetic field generators based on the received output signal from each of the plurality of magnetic field sensors; and
    communicate the determined directional frequency components to the position analyzer;
    a position analyzer coupled to the processor and to measurement circuit, the position analyzer configured to determine a spatial position of each of the plurality of magnetic field generators relative to a coordinate system based on the determined directional frequency components from the measurement circuit and the predetermined locations of each of the one or more magnetic field sensors relative to each other; and
    a gesture analyzer coupled to the position analyzer and to the processor, the gesture analyzer configured to determine a gesture corresponding to the determined spatial positions of each of the plurality of magnetic field generators.

2. The system of claim 1, wherein each of the plurality of magnetic field generators is a single axis electromagnet.

3. The system of claim 2, wherein each electromagnet generates magnetic fields at a different frequency.

4. The system of claim 2, wherein each electromagnet generates magnetic fields at a common frequency, and different electromagnets generate magnetic fields during different time intervals.

5. The system of claim 1, wherein each of the plurality of magnetic field sensors is a three-axis magnetometer.

6. The system of claim 1, the position analyzer further configured to have a Kalman filter, the Kalman filter configured to:
    determine a best current estimate of the spatial position of each of the plurality of magnetic field generators based on a noise model and one or more prior estimates of spatial positions of each of the plurality of magnetic field generators;

generate a confidence interval associated with each of the determined best current estimates; and transmit the determined best current estimates of the spatial position of each of the plurality of magnetic field generators and associated confidence intervals.

7. The system of claim 1, wherein the gesture analyzer is configured to:

generate a state descriptor comprising a combination of the computed spatial positions of each of the plurality of magnetic field generators; and determine the gesture based on the generated state descriptor.

8. The system of claim 7, wherein determine the gesture based on the generated state descriptor comprises:

determine the gesture as a stored gesture corresponding to a stored state descriptor having at least a threshold measure of similarity to the generated state descriptor.

9. The system of claim 8, wherein determine the gesture as the stored gesture corresponding to the stored state descriptor having at least the threshold measure of similarity to the generated state descriptor comprises:

retrieve a mapping table correlating stored state descriptors with corresponding description of gestures; and determine a description of a gesture correlated with a stored state descriptor in the mapping table having at least the threshold measure of similarity to the generated state descriptor.

10. The system of claim 7, wherein determine the gesture based on the generated state descriptor comprises apply a trained machine learning regression model to the generated state descriptor.

11. The system of claim 1, further comprising:

a glove on which each of the plurality of magnetic field generators is located so each magnetic field generator is configured to contact a different portion of a hand of a user when the user wears the glove.

12. The system of claim 11, wherein each of the plurality of magnetic field generators is configured to contact a portion of a different finger of the user when the user wears the glove.

13. The system of claim 11, wherein each of the plurality of magnetic field sensors is located on a portion of the glove configured to contact a portion of the hand of the user when the user wears the glove.

14. The system of claim 13, wherein the plurality of magnetic field sensors comprises: a magnetic field sensor that is located on a portion of the glove configured to contact a palm of the hand of the user and an additional magnetic field sensor that is located on an additional portion of the glove configured to contact the palm of the hand of the user at a predetermined fixed distance from the magnetic field sensor.

15. The system of claim 11, wherein one or more of the plurality of magnetic field sensors are separate from the glove.

16. The system of claim 11, wherein at least one magnetic field generator is located on a portion of the glove configured to contact a palm of the hand of the user, and wherein at least one three axis magnetic field sensor is located on a portion of the glove at a predetermined position located on the wrist of the hand of the user.

17. The system of claim 16, wherein the position analyzer is configured to determine a spatial position of the at least one magnetic field generator located on the portion of the glove configured to contact the palm of the hand of the user.

18. A method comprising:

generating a plurality of magnetic fields from each of a plurality of magnetic field generators;

detecting the plurality of magnetic fields at each of a plurality of magnetic field sensors having predetermined positions relative to each other;

generating an output signal from each of the plurality of magnetic field sensors, the output signal from a magnetic field sensor based on strengths and directions of magnetic fields from each of the plurality of magnetic field generators detected by the magnetic field sensor;

determining directional frequency components corresponding to each of the plurality of magnetic field generators by a measurement circuit coupled to each of the plurality of magnetic field sensors, the measurement circuit configured to determine the directional frequency components corresponding to each of the plurality of magnetic field generators based on the output signal received from each of the plurality of magnetic field sensors; and determining a spatial position of each of the plurality of magnetic field generators from the directional frequency components determined by the measurement circuit and the predetermined locations of the plurality of magnetic field sensors relative to each other; and determining a gesture based on the computed spatial positions of each of the plurality of magnetic field generators.

19. The method of claim 18, wherein each of the plurality of magnetic field generators is a single axis electromagnet.

20. The method of claim 19, wherein each electromagnet generates magnetic fields at a different frequency.

21. The method of claim 19, wherein each electromagnet generates magnetic fields at a common frequency, and different electromagnets generate magnetic fields during different time intervals.

22. The method of claim 18, wherein each of the plurality of magnetic field sensors is a three-axis magnetometer.

23. The method of claim 18, wherein determining the gesture based on the computed spatial positions of each of the plurality of magnetic field generators comprises:

generating a state descriptor comprising a combination of the computed spatial positions of each of the plurality of magnetic field generators; and determining the gesture based on the generated state descriptor.

24. The method of claim 23, wherein determining the gesture based on the generated state descriptor comprises:

determining the gesture as a stored gesture corresponding to a stored state descriptor having at least a threshold measure of similarity to the generated state descriptor.

25. The method of claim 24, wherein determining the gesture as the stored gesture corresponding to the stored state descriptor having at least the threshold measure of similarity to the generated state descriptor comprises:

retrieving a mapping table correlating stored state descriptors with corresponding description of gestures; and determining a description of a gesture correlated with a stored state descriptor in the mapping table having at least the threshold measure of similarity to the generated state descriptor.

* * * * *

UNITED STATES PATENT AND TRADEMARK OFFICE
CERTIFICATE OF CORRECTION

PATENT NO. : 11,347,310 B2
APPLICATION NO. : 16/441896
DATED : May 31, 2022
INVENTOR(S) : Shiu Sang Ng It is certified that error appears in the above-identified patent and that said Letters Patent is hereby corrected as shown below:

In the Claims

In Column 25, Claim 16, Line 62, delete "three axis" and insert -- three-axis --, therefor.

In Column 26, Claim 18, Line 14, delete "determing" and insert -- determining --, therefor.

In Column 26, Claim 18, Line 23, delete "sensors; and" and insert -- sensors; --, therefor.

Signed and Sealed this
Thirteenth Day of September, 2022

Katherine Kelly Vidal
*Director of the United States Patent and Trademark Office*